US012690191B2

(12) United States Patent
Chih et al.

(10) Patent No.: US 12,690,191 B2
(45) Date of Patent: Jul. 21, 2026

(54) ONE-TIME-PROGRAMMABLE MEMORY DEVICES AND METHODS FOR FORMING THE SAME

(71) Applicant: Taiwan Semiconductor Manufacturing Company, Ltd., Hsinchu (TW)

(72) Inventors: Yu-Der Chih, Hsinchu City (TW); Ya-Chin King, Hsinchu City (TW); Chrong Lin, Hsinchu City (TW); Jonathan Tsung-Yung Chang, Hsinchu City (TW); Yun-Sheng Chen, Hsinchu City (TW); May-Be Chen, Hsinchu City (TW); Hsin-Yuan Yu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 444 days.

(21) Appl. No.: 18/326,228

(22) Filed: May 31, 2023

(65) Prior Publication Data

US 2024/0407159 A1 Dec. 5, 2024

(51) Int. Cl.
*H10B 20/25* (2023.01)
(52) U.S. Cl.
CPC .................................... *H10B 20/25* (2023.02)
(58) Field of Classification Search
CPC ...................................................... H10B 20/25
See application file for complete search history.

(56) References Cited

U.S. PATENT DOCUMENTS

| | | | | |
|---|---|---|---|---|
| 10,153,288 B2 * | 12/2018 | Chang | .................... | H10B 20/25 |
| 11,729,997 B2 * | 8/2023 | Lin | .................... | H10D 84/0149 |
| 2009/0230512 A1 * | 9/2009 | Baek | .................. | G11C 13/0011 |
| | | | | 257/536 |

FOREIGN PATENT DOCUMENTS

| | | |
|---|---|---|
| CN | 111312747 A | 6/2020 |
| TW | 201631588 A | 9/2016 |
| TW | 202201753 A | 1/2022 |

OTHER PUBLICATIONS

Office Action issued in connection with Taiwan Appl. No. 112145883 dated Sep. 23, 2024.

* cited by examiner

*Primary Examiner* — Allison Bernstein
(74) *Attorney, Agent, or Firm* — Foley & Lardner LLP

(57) ABSTRACT

A memory device is disclosed. The memory device includes a memory cell comprising: a transistor; and a plurality of pairs of resistors coupled to the transistor in series, each of the pairs of resistors including a first resistor and a second resistor. The transistor is formed along a major surface of a substrate. At least a first one of the pairs of resistors are formed in a first one of a plurality of metallization layers disposed above the transistor. At least a second one of the pairs of resistors are formed in a second one of the plurality of metallization layers, the second metallization layer being disposed above the first metallization layer.

18 Claims, 10 Drawing Sheets

600

800

838 — 832

836

852

878

856

872

876

(760&770) Q3

874

Q1 (720&730)

834

Q2 (740&750)

854

858

806

804

1000

| S | D | Y |
|---|---|---|
| 0 | 0 | $Q_1Q_2+Q_2'Q_3$ |
| 0 | 1 | $Q_1Q_2+Q_2'Q_3$ |
| 1 | 0 | 0 |
| 1 | 1 | 1 |

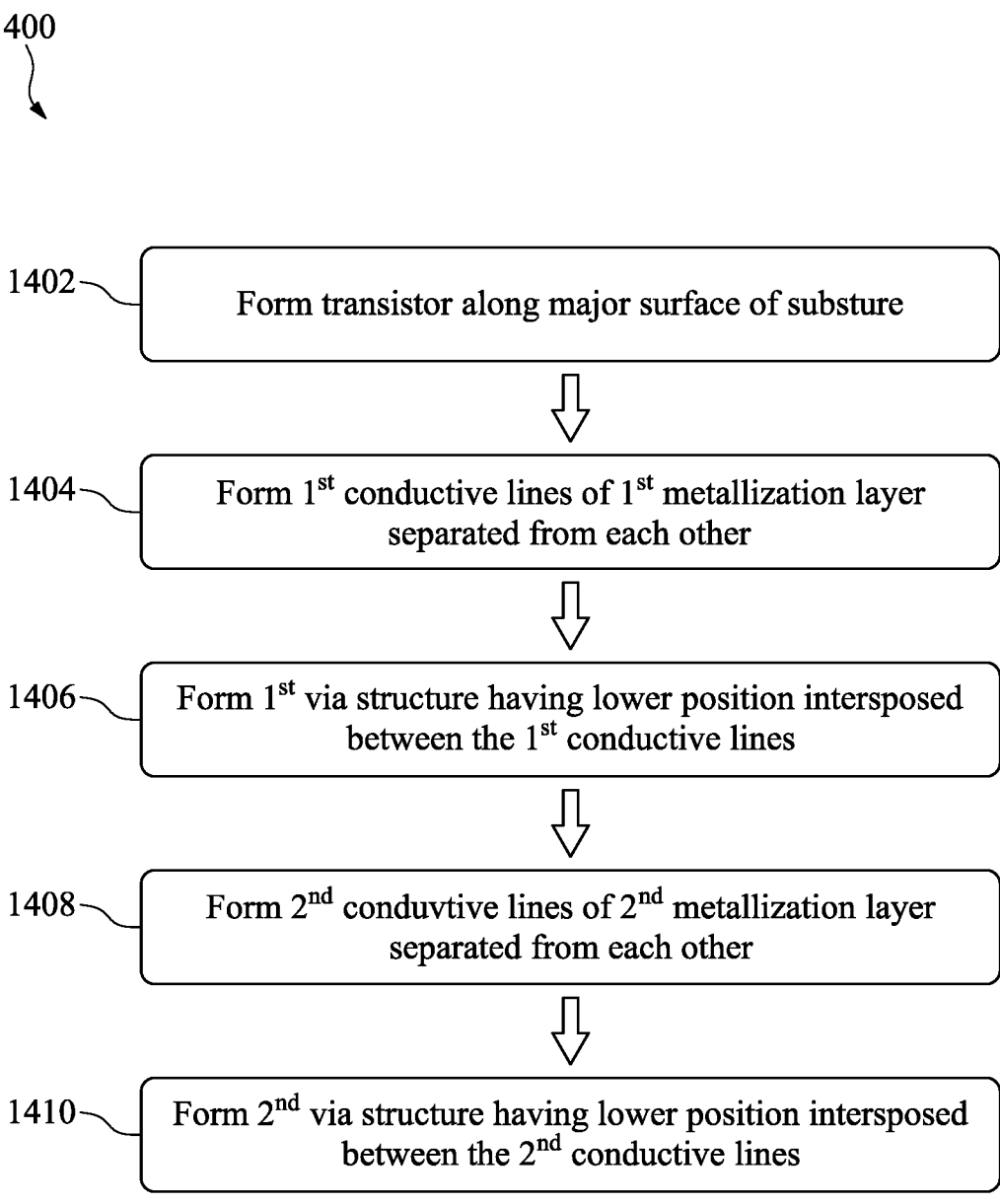

1402 — Form transistor along major surface of substure

1404 — Form 1st conductive lines of 1st metallization layer separated from each other 1406 — Form 1st via structure having lower position intersposed between the 1st conductive lines 1408 — Form 2nd conduvtive lines of 2nd metallization layer separated from each other 1410 — Form 2nd via structure having lower position intersposed between the 2nd conductive lines

Fig. 14

ONE-TIME-PROGRAMMABLE MEMORY DEVICES AND METHODS FOR FORMING THE SAME

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 illustrates a sequence of operations of the memory cell of FIG. 6, in accordance with some embodiments.

FIG. 14 illustrates an example flow chart of a method for forming a semiconductor device, in accordance with some embodiments.

DETAILED DESCRIPTION

Figure 1:
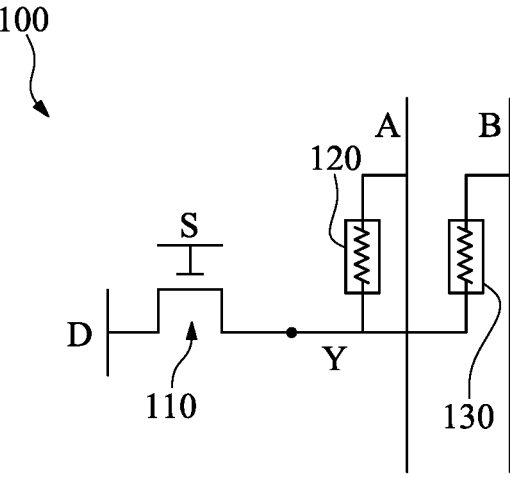
FIG. 1 illustrates a circuit diagram of a memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, unconventional non-volatile memory devices, such as ferroelectric random access memory (FRAM) devices, magnetic random access memory (MRAM) devices, phase-change random access memory (PRAM) devices, and resistive random access memory (RRAM) devices, have emerged. In particular, RRAM devices, which exhibit a switching behavior between a high resistance state and a low resistance state, have various advantages over conventional non-volatile memory devices. Such advantages include, for example, compatible fabrication steps with current complementary-metal-oxide-semiconductor (CMOS) technologies, low-cost fabrication, a compact structure, flexible scalability, fast switching, high integration density, etc.

With the increasing use of integrated circuits in electronic devices that provide different types of information for a variety of different applications, there has been an increasing need to adequately protect sensitive and/or critical information that may be stored within an electronic device to limit access to such information to only other devices that have permission to access the information. Some examples of applications include the authentication of devices, protection of confidential information within a device, and securing a communication between two or more devices. A one-time-programmable (OTP) memory device (e.g., efuse, antifuse) is one type of the non-volatile memory devices utilized in integrated circuits for storing such sensitive and/or critical information.

The present disclosure provides various embodiments of a memory device that includes a number of anti-fuse-like memory cells, each of which can reversibly or irreversibly transition between a first resistance state and a second resistance state. In some embodiments, the disclosed anti-fuse-like memory cell may be a one-time-programmable (OTP) memory cell that allows one time or a limited number of programming operations, in some embodiments. For example, the anti-fuse-like memory cell may have a first resistance state as fabricated, and may be permanently (irreversibly) programmed to a second resistance state. In another example, such programming operation may be reversible. Each of the disclosed anti-fuse-like memory cells is implemented as a one-transistor-many-resistor (1TmR) structure. In one embodiment, the disclosed anti-fuse-like memory cell may include a transistor and at least one pair of resistors, in which the transistor is formed in a front-end-of-line (FEOL) network/processing and the at least one pair of resistors are formed in a back-end-of-line (BEOL) network/processing. The pair of resistors respectively have one of their terminals commonly connected to a source/drain terminal of the transistor. The transistor can provide a conduction path for the anti-fuse-like memory cell, while the pair of resistors can serve as a storage portion of the anti-fuse-like memory cell which is configured to be programmed once or limited times.

For example, the pair of resistors includes (i) a first resistor formed of a first dielectric material laterally interposed between a via structure and a first conductive line; and (ii) a second resistor formed of a second dielectric material laterally interposed between the same via structure and a second conductive line. The first and second conductive lines are formed in an identical one of a number of metallization layers of the BEOL network. When being programmed, one of the first dielectric material or the second dielectric material is configured to switch to a high resistance state (sometimes referred to as "H"), while the other of the first dielectric material or the second dielectric material is configured to remain at a low resistance state (sometimes referred to as "L"). As such, when being read, an output node of the anti-fuse-like memory cell (the node connected between the first resistor and the second resistor) can be latched to one of the first resistor or second resistor being programmed, which can advantageously, significantly widen a read window of the anti-fuse-like memory cell.

In another embodiment, the disclosed anti-fuse-like memory cell may include a transistor and multiple pairs of resistors, in which at least two pairs of the resistors are formed in respectively different metallization layers. Equivalently, the storage portions are disposed across multiple different metallization layers. Such a configuration can make it significantly difficult to crack data stored in the anti-fuse-like memory cell. For example, a first portion of the data may be stored in a first metallization layer, and a second portion of the data may be stored in a second, higher metallization layer. In an attempt to reverse engineer the data by derailing the metallization layers, some portion of the data may have already been removed and thus cannot be accessed.

FIG. 1 illustrates an example circuit diagram of an anti-fuse-like memory cell 100, in accordance with some embodiments. In the example of FIG. 1, the anti-fuse-like memory cell 100 is configured in a one-transistor-two-resistor (1T2R) structure.

For example, the anti-fuse-like memory cell 100 includes a transistor 110, a first resistor 120, and a second resistor 130. The transistor 110 has a gate terminal connected to access line "S," a first source/drain terminal connected to access line "D," and a second source/drain terminal commonly connected to the first and second resistors, 120 and 130. Specifically, each of the first and second resistors, 120 and 130, has a first terminal connected to the second source/drain terminal of the transistor 110 at node "Y," and a second terminal connected to a respective access line, e.g., the second terminal of the first resistor 120 connected to access line "A" and the second terminal of the second resistor 130 connected to access line "B." It, however, should be understood that the anti-fuse-like memory cell 100 may be configured in any of various other structures (e.g., one-transistor-four-resistor (1T4R) structure, one-transistorsixth-resistor (1T6R) structure), while remaining within the scope of the present disclosure.

As will be discussed in further detail below, the first resistor 120 and second resistor 130 each include a dielectric material laterally interposed between a common via structure and a respective conductive line. Stated another way, the first terminal (node Y) and second terminal (access line A) of the first resistor 120 may correspond to a common via structure and a respective first conductive line, respectively, in which a first dielectric material interposed between the common via structure and the first conductive line can serve a resistive portion of the first resistor 120. Similarly, the first terminal (node Y) and second terminal (access line B) of the second resistor 130 may correspond to the common via structure and a respective second conductive line, respectively, in which a second dielectric material interposed between the common via structure and the second conductive line can serve a resistive portion of the second resistor 130. The first and second dielectric materials each include transition metal oxide, which allows the first and second resistors, 120 and 130, to be programmed between a first (e.g., high) resistance state and a second (e.g., low) resistance state.

Figure 2:
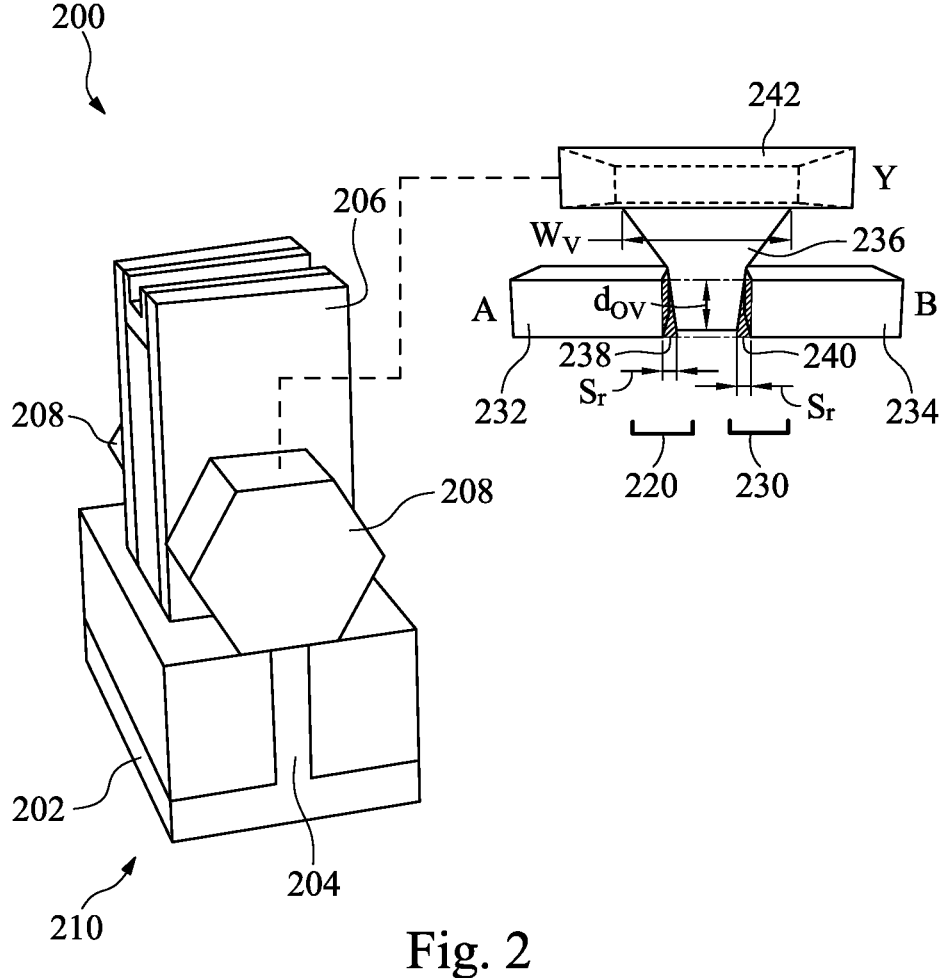
FIG. 2 illustrates a perspective view of a semiconductor device including a portion of the memory cell of FIG. 1, in accordance with some embodiments.

In various embodiments of the present disclosure, the anti-fuse-like memory cell 100 may be formed across both of a FEOL network and BEOL network over a substrate, as illustrated in an example semiconductor device 200 of FIG. 2. As shown, the semiconductor device 200 includes a transistor 210 formed in a FEOL network, and two resistors, 220 and 230, formed in a BEOL network. The transistor 210 may correspond to the transistor 110 of FIG. 1, and the resistors, 220 and 230, may correspond to the resistors, 120 and 130 of FIG. 1, respectively.

In the illustrated example of FIG. 2, the transistor 210 is formed as a FinFET structure. However, the transistor 210 can be formed in any of various other transistor structures (e.g., gate-all-around (GAA) FET structure), while remaining within the scope of the present disclosure. For example in FIG. 2, over a substrate 202, the transistor 210 includes a fin-like structure 204 protruding from the substrate 202, a gate structure 206 straddling the fin-like structure 204, and a pair of source/drain structures 208 disposed on opposite sides of the gate structure 206 and connected to ends of the fin-like structure 204, respectively.

Such features formed along a major surface of the substrate 202 are typically referred to as a part of a FEOL network. Over the FEOL network, a number of metallization layers, each including a number of conductive lines, and a number of via structures, each connecting the conductive lines of adjacent metallization layers, can be formed. The metallization layers and the via structures are typically referred to as a part of a BEOL network. These metallization layers are sometimes referred to as "M1 layer," "M2 layer," "M3 layer," "M4 layer," and so on, in an order from the bottommost one to the topmost one, respectively. Similarly, the via structure connecting the M1 layer and M2 layer, the via structure connecting the M2 layer and M3 layer, the via structure connecting the M3 layer and M4 layer, and the via structure connecting the M4 layer and M5 layer are sometimes referred to as "via1 structure," "via2 structure," "via3 structure," and "via4 structure," respectively.

In some embodiments, the resistors 220 and 230 are formed in such a BEOL network. For example, the resistor 220 is formed of a first conductive line 232, a via structure 236, and a first dielectric material 238; and the resistor 230 is formed of a second conductive line 234, the via structure 236, and a second dielectric material 240. The first conductive line 232 and the via structure 236 can serve as a first terminal and a second terminal of the resistor 220, with the first dielectric material 238 serving as a resistive (or storage) portion of the resistor 220; and the second conductive line 234 and the via structure 236 can serve as a first terminal and a second terminal of the resistor 230, with the second dielectric material 240 serving as a resistive (or storage) portion of the resistor 230.

Further, the via structure 236 has a lower portion downwardly extending between the first and second conductive lines, 232 and 234. As such, the first dielectric material 238 is laterally interposed between the first conductive line 232 and the via structure 236; and similarly, the second dielectric material 240 is laterally interposed between the second conductive line 234 and the via structure 236. The first conductive line 232 and the second conductive line 234 are disposed in the same metallization layer (e.g., M1 layer), and thus, the via structure 236 may be a via 1 which can be connected to a conductive line 242 in the upper metallization layer (e.g., M2 layer). The conductive line 242 may be coupled to one of the source/drain structures 208 of the transistor 210. Corresponding to the circuit diagram of FIG. 1, the first conductive line 232 and second conductive line 234 may correspond to the access line A and access line B, respectively, and the via structure 236 may correspond to the internal node Y.

In some embodiments, the first dielectric material 238 and second dielectric material 240 each include transition metal oxide (TMO), which has a variable resistance value. As a non-limiting example, such transition metal oxide may include silicon dioxide ($SiO_2$) and tantalum oxynitride (TaON). As another non-limiting example, the transition metal oxide can be selected from the group consisting of: $TiO_x$, $NiO_x$, $HfO_x$, $NbO_x$, $CoO_x$, $FeO_x$, $CuO_x$, $VO_x$, $TaO_x$, $WO_x$, $CrO_x$, and combinations thereof. The conductive lines (e.g., 232, 234, 242) and the via structures (e.g., 236) connecting the conductive lines in different metallization layers may each be formed of copper (Cu), while any of various other metal or conductive materials can be contemplated such as, for example, Ti, Ni, Hf, Nb, Co, Fe, Cu, V, Ta, W, Cr, or combinations thereof.

In some embodiments, respective dimensions of some of the components of the resistors 220 and 230 can be characterized as follows. For example, the lower portion of the via structure 236 that extending into the space between the first conductive line 232 and the second conductive line 234 has a depth ($d_{ov}$), which is about 2~5 nanometers (nm). Further, the first dielectric material 238 laterally interposed between the via structure 236 and the first conductive line 232 and the second dielectric material 240 laterally interposed between the via structure 236 and the second conductive line 234 each have a spacing ($S_r$), which is in a range from about $\frac{1}{3}W_v$ to about $\frac{1}{5}W_v$, where $W_v$ represents a (e.g., maximum) width of the via structure 236.

Figures 3, 4:
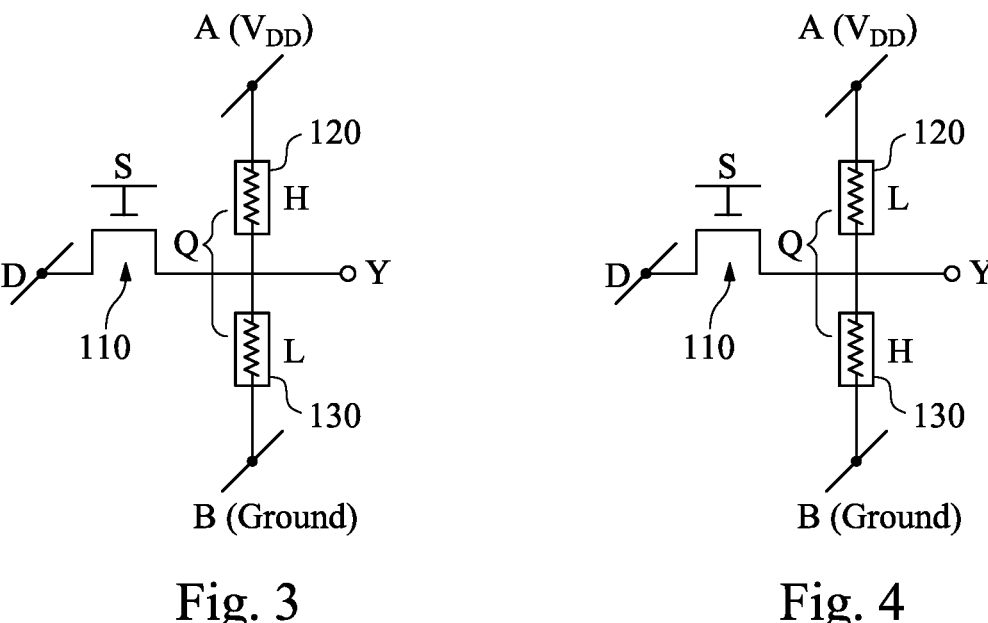
FIG. 3 illustrates an example operation of the memory cell of FIG. 1, in accordance with some embodiments.
FIG. 4 illustrates another example operation of the memory cell of FIG. 1, in accordance with some embodiments.

FIG. 3 and FIG. 4 illustrate example (e.g., read) operations of the memory cell 100 (FIG. 1), respectively, in accordance with various embodiments of the present disclosure. Generally, the first resistor 120 and the second resistor 130, forming a memory portion "Q" of the memory cell 100, are complementarily programmed. That is, one of the first resistor 120 or the second resistor 130 is programmed into a first (e.g., high) resistance state, while the other of the first resistor 120 or the second resistor 130 is programmed into a second (e.g., low) resistance state. For example in FIG. 3, the first resistor 120 is programmed into a high resistance state ("H"), while the second resistor 130 is programmed into a low resistance state ("L"). Using the corresponding semiconductor device 200 of FIG. 2 as an example, the second dielectric material 240 (the resistor 130) may have been broken down (i.e., becoming more conductive), while the first dielectric material 238 (the resistor 120) may remain being dielectric. In FIG. 4, the first resistor 120 is programmed into the low resistance state ("L"), while second resistor 130 is programmed into the high resistance state ("H"). Continuing with the semiconductor device 200 of FIG. 2 as an example, the first dielectric material 238 (the resistor 120) may have been broken down (i.e., becoming more conductive), while the second dielectric material 240 (the resistor 130) may remain being dielectric.

To read the memory cell 100 programmed as the example of FIG. 3, the access lines A and B are applied with VDD and ground, respectively, for example. The access line S is applied with a logic high voltage turning on the transistor 110, and the access line D may be floating. Since the transistor 110 is turned on, the voltages present at the node Y and on the access line D may be substantially equal to each other. As the resistor 120 is at the high resistance state, the node Y is equivalently disconnected from the access line A, and thus, the voltage at the node Y may be close to the ground voltage. Similarly, to read the memory cell 100 programmed as the example of FIG. 4, the access lines A and B are applied with VDD and ground, respectively, for example. The access line S is applied with a logic high voltage turning on the transistor 110, and the access line D may be floating. Since the transistor 110 is turned on, the voltages present at the node Y and on the access line D may be substantially equal to each other. As the resistor 120 is at the low resistance state, the node Y is equivalently connected to the access line A, and thus, the voltage at the node Y may be close to VDD.

Figure 5:
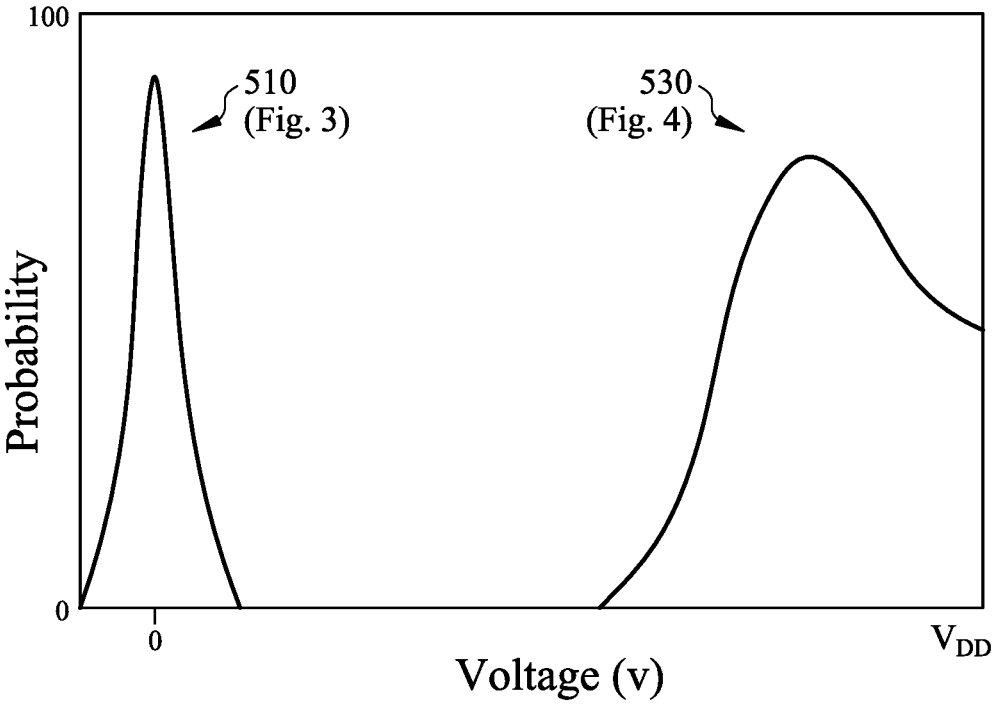
FIG. 5 illustrates a schematic graph of probabilities for different voltages output by (or read from) the memory cell of FIG. 1, in accordance with some embodiments.

FIG. 5 illustrates a schematic graph of probabilities for different voltages output by (or read from) the memory cell 100, in accordance with various embodiments of the present disclosure. The output voltage may be the voltage present at the node Y or on the access line D (when the transistor 110 is turned on). As shown in FIG. 5, the graph includes two plots 510 and 530 having their respective peaks occurred at the ground voltage and VDD. The plots 510 and 530 may correspond to the operation statuses of FIG. 3 and FIG. 4, respectively. By utilizing such complementary resistance states between the first resistor 120 and second resistor 130 (one of which is programmed at the high resistance state and the other of which is programmed at the low resistance state), the output voltage can be stabilized at either VDD or ground. Further, the two plots 510 and 530 can be separated apart from each other with a substantially large voltage window (i.e., no overlap), as shown in FIG. 5. Such a voltage window is sometimes referred to as a read window of the memory cell 100.

Figure 6:
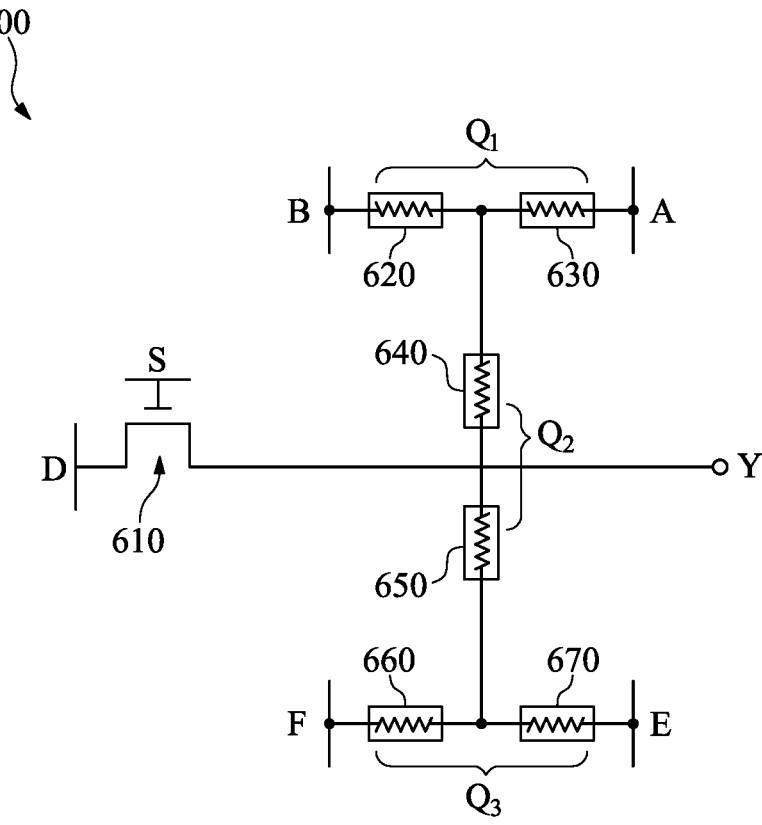
FIG. 6 illustrates a circuit diagram of another memory cell, in accordance with some embodiments.

FIG. 6 illustrates an example circuit diagram of an anti-fuse-like memory cell 600, in accordance with some embodiments. In the example of FIG. 6, the anti-fuse-like memory cell 600 is configured based on a one-transistor-two-resistor (1T2R) structure, e.g., a one-transistor-six-resistor (1T6R) structure.

For example, the anti-fuse-like memory cell 600 includes a transistor 610, a pair of first resistors, 620 and 630, a pair of second resistors, 640 and 650, and a pair of third resistors, 660 and 670. The transistor 610 has a gate terminal connected to access line "S," a first source/drain terminal connected to access line "D," and a second source/drain terminal commonly connected to the second pair of resistors, 640 and 650. Specifically, each of the resistors, 640 and 650, has a first terminal connected to the second source/drain terminal of the transistor 610 at node "Y," and a second terminal connected to a respective pair of the first or third resistors. The second terminal of the resistor 640 is commonly connected to first terminals of the first pair of resistors, 620 and 630; and the second terminal of the resistor 650 is commonly connected to first terminals of the third pair of resistors, 660 and 670. Second terminals of the first pair of resistors, 620 and 630, are connected to an access line "B" and an access line "A," respectively; and second terminals of the third pair of resistors, 660 and 670, are connected to an access line "F" and an access line "E," respectively. In some embodiments, the first pair of resistors, 620 and 630, may form a first memory portion "Q$_1$" of the memory cell 600; the second pair of resistors, 640 and 650, may form a second memory portion "Q$_2$" of the memory cell 600; and the third pair of resistors, 660 and 670, may form a third memory portion "Q$_3$" of the memory cell 600.

Similar to the memory cell 100, the memory cell 600 may be formed across both of a FEOL network and BEOL network over a substrate. For example, the transistor 610 is formed in a FEOL network, and the plural pairs of resistors, 620 to 670, are formed in a BEOL network, as illustrated in an example semiconductor device 700 of FIG. 7.

Figure 7:
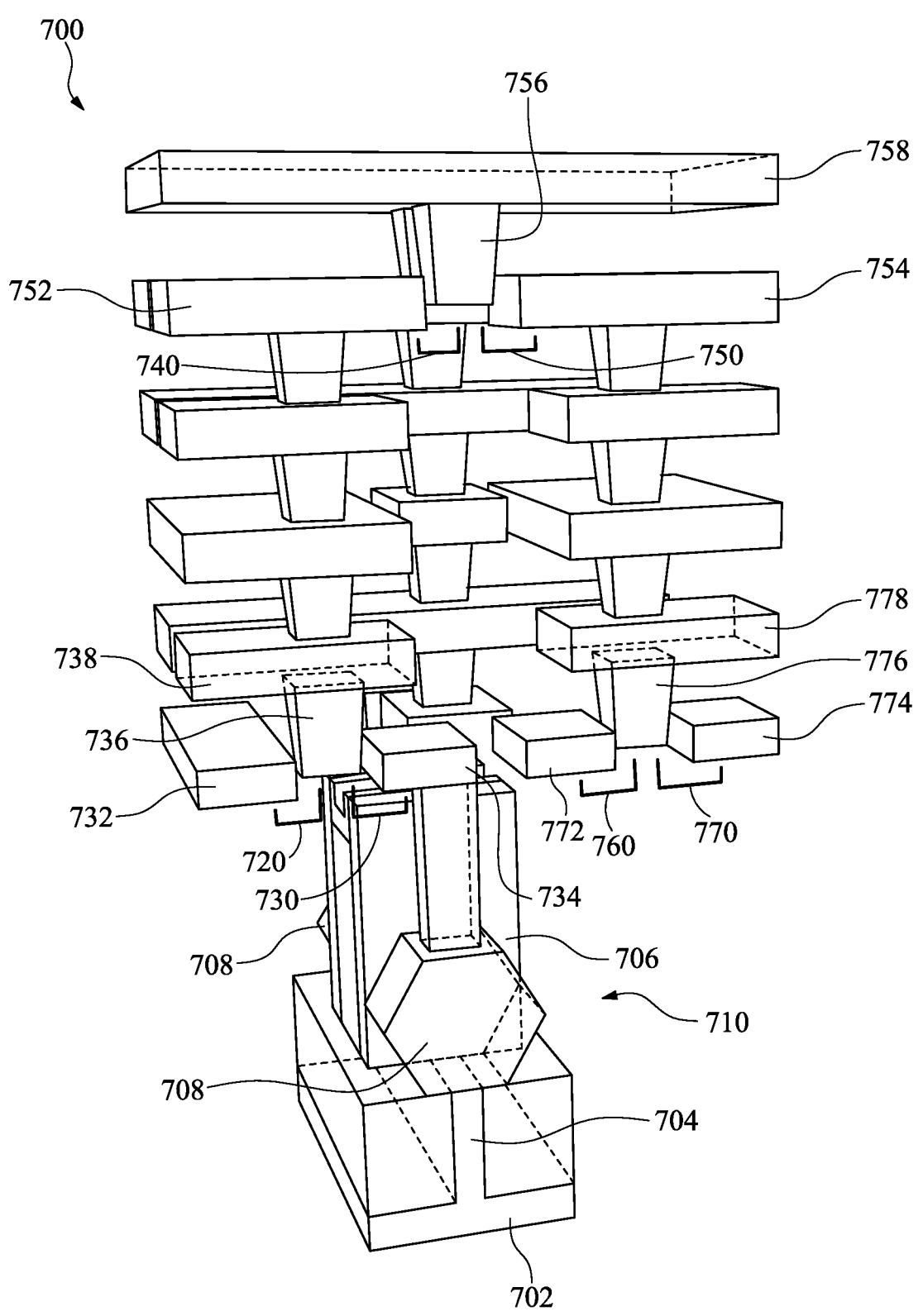
FIG. 7 illustrates a perspective view of a semiconductor device operatively implemented as the memory cell of FIG. 6, in accordance with some embodiments.

As shown in FIG. 7, the semiconductor device 700 includes a transistor 710 formed in a FEOL network, and a first pair of resistors, 720 and 730, a second pair of resistors, 740 and 750, and a third pair of resistors, 760 and 770, that are formed in a BEOL network. The transistor 710 may correspond to the transistor 610 of FIG. 6; the first pair of resistors, 720 and 730, may correspond to the first pair of resistors, 620 and 630 of FIG. 6, respectively; the second pair of resistors, 740 and 750, may correspond to the second pair of resistors, 640 and 650 of FIG. 6, respectively; and the third pair of resistors, 760 and 770, may correspond to the third pair of resistors, 660 and 670 of FIG. 6, respectively.

In the illustrated example of FIG. 7, the transistor 710 is formed as a FinFET structure. However, the transistor 710 can be formed in any of various other transistor structures (e.g., gate-all-around (GAA) FET structure), while remaining within the scope of the present disclosure. For example in FIG. 7, over a substrate 702, the transistor 710 includes a fin-like structure 704 protruding from the substrate 702, a gate structure 706 straddling the fin-like structure 704, and a pair of source/drain structures 708 disposed on opposite sides of the gate structure 706 and connected to ends of the fin-like structure 704, respectively. Over the FEOL network where the transistor 710 is formed, a BEOL network including a number of metallization layers, e.g., M1 layer, M2 layer, M3 layer, M4 layer, M5 layer, M6 layer, etc., is formed.

The different pairs of resistors, 720 & 730, 740 & 750, and 760 & 770, are formed across at least two different ones of the metallization layers in the BEOL network, in accordance with various embodiments. As shown, the resistors 720 and 730 are formed in the M1 layer; the resistors 760 and 770 are formed in the M1 layer; and the resistors 740 and 750 are formed in the M5 layer. As such, different memory portions (e.g., Q$_1$, Q$_2$, and Q$_3$) of the memory cell 600, corresponding to the semiconductor device 700, can be disposed in respective metallization layers, which can further enhance security of data stored in the memory cell 600.

Specifically in the illustrated example of FIG. 7, the resistor 720 can be formed by a first dielectric material laterally interposed between a via1 structure 736 and a conductive line 732 (in the M1 layer); the resistor 730 can be formed by a second dielectric material laterally interposed between the via1 structure 736 and a conductive line

734 (in the M1 layer); the resistor 760 can be formed by a third dielectric material laterally interposed between a via1 structure 776 and a conductive line 772 (in the M1 layer); the resistor 770 can be formed by a fourth dielectric material laterally interposed between the via1 structure 776 and a conductive line 774 (in the M1 layer); the resistor 740 can be formed by a fifth dielectric material laterally interposed between a via5 structure 756 and a conductive line 752 (in the M5 layer); and the resistor 750 can be formed by a sixth dielectric material laterally interposed between the via1 structure 756 and a conductive line 754 (in the M5 layer). Further, the via1 structure 736 can be connected to a conductive line 738 (in the M2 layer); the via1 structure 776 can be connected to a conductive line 778 (in the M2 layer); and the via5 structure 756 can be connected to a conductive line 758 (in the M6 layer).

According to various embodiments of the present disclosure, each of the above-mentioned first to sixth dielectric materials is similar to the dielectric material 238/240 (FIG. 2). For the purposes of clarity, the first to sixth dielectric materials are not shown in FIG. 7. For example, each of the first to sixth dielectric materials includes transition metal oxide (TMO), which has a variable resistance value. As a non-limiting example, such transition metal oxide may include silicon dioxide (SiO$_2$) and tantalum oxynitride (TaON). As another non-limiting example, the transition metal oxide can be selected from the group consisting of: TiO$_x$, NiO$_x$, HfO$_x$, NbO$_x$, CoO$_x$, FeO$_x$, CuO$_x$, VO$_x$, TaO$_x$, WO$_x$, CrO$_x$, and combinations thereof. The conductive lines (e.g., 732-734, 738, 772-774, 778, 752-754, 758) and the via structures (e.g., 736, 776, 756) connecting the conductive lines in different metallization layers may each be formed of copper (Cu), while any of various other metal or conductive materials can be contemplated such as, for example, Ti, Ni, Hf, Nb, Co, Fe, Cu, V, Ta, W, Cr, or combinations thereof.

Figure 8:
FIG. 8 illustrates an example layout of the semiconductor device of FIG. 7, in accordance with some embodiments.

FIG. 8 illustrates an example layout 800 that can be used to fabricate the semiconductor device 700 (e.g., the memory cell 600 of FIG. 6), in accordance with various embodiments of the present disclosure. As will be discussed in further detail below, the layout 800 include a number of patterns that can be utilized to define the components of the semiconductor device 700. The layout 800 has been simplified to illustrate the patterns that form certain components of the semiconductor device 700. Thus, it should be understood that the layout 800 can include any of various other patterns, while remaining within the scope of the present disclosure.

As shown in FIG. 8, the layout 800 includes patterns 804 and 806 configured to form various components in the FEOL network. For example, the pattern 804 is configured to form an active region (herein referred to as an "oxide diffusion (OD) 804"); and the pattern 806 is configure to form a gate structure (herein referred to as a "POLY 806"). In some embodiments, the OD 804 and POLY 806 can thus define the transistor 710 of the semiconductor device 700, in which the OD 804 forms the channel 704 and the source/drain structures 708, and the POLY 806 forms the gate structure 706.

The layout 800 further includes patterns 832, 834, 836, 838, 872, 874, 876, 878, 852, 854, 856, and 858 configured to form various components in the BEOL network. For example, the patterns 832, 834, 872, and 874 are configured to form conductive lines in the M1 layer (herein referred to as "M1 832," "M1 834," "M1 872," and "M1 874," respectively); the patterns 836 and 876 are configured to form via1 structures (herein referred to as "via1 836" and "via1 876," respectively); the patterns 838 and 878 are configured to form conductive lines in the M2 layer (herein referred to as "M2 838" and "M2 878," respectively); the patterns 852 and 854 are configured to form conductive lines in the M5 layer (herein referred to as "M5 852" and "M5 854," respectively); the pattern 856 is configured to form a via5 structure (herein referred to as "via5 856"); and the pattern 858 is configured to form a conductive line in the M6 layer (herein referred to as "M6 858").

In some embodiments, such BEOL components can thus form the first to third pairs of resistors 720-730, 760-770, and 740-750 of the semiconductor device 700. For example, the M1s 832 and 834 can correspond to the conductive lines 732 and 732, respectively; the via1s 836 and 876 can correspond to the via1 structures 736 and 776, respectively; the M2s 838 and 878 can correspond to the conductive lines 738 and 778, respectively; the M5s 852 and 854 can correspond to the conductive lines 752 and 754, respectively; the via5 856 can correspond to the via5 structure 756; and the M6 858 can correspond to the conductive line 758. As such, the memory portion $Q_1$ (resistors 720 and 730) can be formed at least by the M1s 832-834, via1 836, a dielectric material interposed between the via1 836 and the M1 832, and a dielectric material interposed between the via1 836 and the M1 834; the memory portion $Q_3$ (resistors 760 and 770) can be formed at least by the M1s 872-874, via1 876, a dielectric material interposed between the via1 876 and the M1 872, and a dielectric material interposed between the via1 876 and the M1 874; and the memory portion $Q_2$ (resistors 740 and 750) can be formed at least by the M5s 852-854, via5 856, a dielectric material interposed between the via5 856 and the M5 852, and a dielectric material interposed between the via5 856 and the M5 854.

Figure 9:
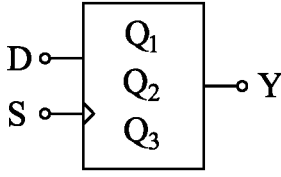
FIG. 9 illustrates a block diagram representing the memory cell of FIG. 6, in accordance with some embodiments.
Figure 10:
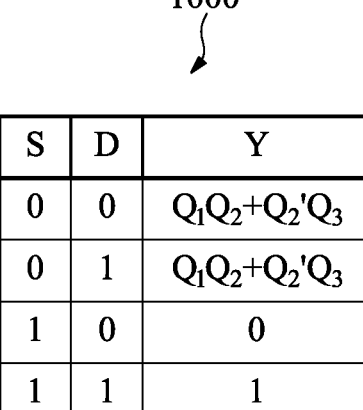
FIG. 10 illustrates a truth table associated with the memory cell of FIG. 6, in accordance with some embodiments.

Referring again to FIG. 6, the memory cell 600 includes a logic portion (e.g., transistor 610) and a number of memory portions (e.g., $Q_1$, $Q_2$, and $Q_3$). In some embodiments, the memory cell 600 may be defined as a standard cell in a cell library or an electronic component having inputs "D" and "S," and output "Y," as shown in FIG. 9. The memory cell 600 can store various logic states based on the logic states respectively programmed into the memory portions $Q_1$, $Q_2$, and $Q_3$, as illustrated in the truth table 1000 of FIG. 10. For example, when the inputs S and D are both at logic 0, the output Y can be expressed as $Q_1Q_2+Q_2'Q_3$; when the inputs S and D are at logic 0 and logic 1, respectively, the output Y can be expressed as $Q_1Q_2+Q_2'Q_3$; when the inputs S and D are at logic 1 and logic 0, respectively, the output Y may be tied to logic 0 (through the turned-on transistor 610); and when the inputs S and D are both at logic 1, the output Y may be tied to logic 1 (through the turned-on transistor 610). In some embodiments, each of the portions $Q_1$, $Q_2$, and $Q_3$ can present logic 1 when a first one of its two resistors is programmed into H (high resistance state) and a second one of its two resistors is programmed into L (low resistance state), and present logic 0 when the first resistor is programmed into L and the second resistor is programmed into H.

Figure 11:
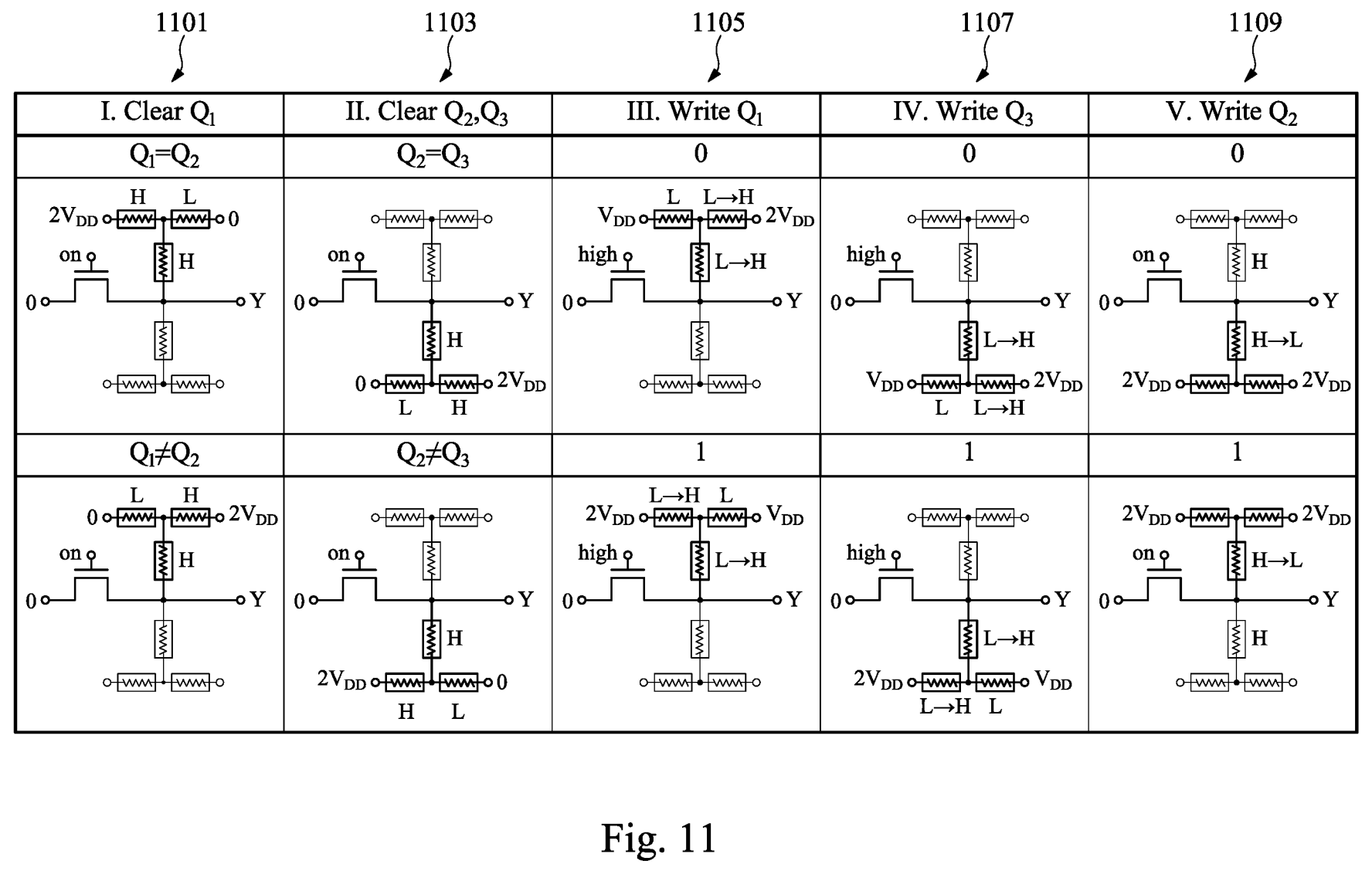

Referring next to FIG. 11, example operation stages, 1101, 1103, 1105, 1107, and 1109, of the memory cell 600 are illustrated. In some embodiments, the operation stages 1101 to 1109 form an operation sequence in the order shown in FIG. 11. For example, the memory cell 600 may be operated from stage 1101, through 1103-1107, and to 1109. In stage 1101, the memory portion $Q_1$ of the memory cell 600 is cleared (or reset); in stage 1103, the memory portions $Q_2$ and $Q_3$ of the memory cell 600 are cleared (or reset); in stage 1105, the memory portion $Q_1$ of the memory cell 600 is programmed; in stage 1107, the memory portion $Q_3$ of the memory cell 600 is programmed; and in stage 1109, the memory portion $Q_2$ of the memory cell 600 is programmed.

In stage 1101 (resetting $Q_1$), two combinations of voltages applied to the access lines D, S, B, and A, respectively, are shown. When the logic states previously programmed into the memory portions $Q_1$ and $Q_2$ (e.g., the resistors 620, 630, and 640 were programmed at H, L, and H, respectively) are the same, the voltages applied to the access lines D, S, B, and A correspond to or are equal to logic 0, logic 1, 2VDD, and logic 0, respectively, causing the resistors 620 and 640 to transition to L. When the logic states previously programmed into the memory portions $Q_1$ and $Q_2$ (e.g., the resistors 620, 630, and 640 were programmed at L, H, and H, respectively) are different, the voltages applied to the access lines D, S, B, and A correspond to or are equal to logic 0, logic 1, logic 0, and 2VDD, respectively, causing the resistors 630 and 640 to transition to L. Regardless of the logic states previously programmed to the resistors 620 to 640, each of the resistors 620 to 640 is reset to the low resistance state (L), i.e., breaking down the corresponding dielectric material.

In stage 1103 (resetting $Q_2$ and $Q_3$), two combinations of voltages applied to the access lines D, S, F, and E, respectively, are shown. When the logic states previously programmed into the memory portions $Q_2$ and $Q_3$ (e.g., the resistors 650, 660, and 670 were programmed at H, L, and H, respectively) are the same, the voltages applied to the access lines D, S, F, and E correspond to or are equal to logic 0, logic 1, logic 0, and 2VDD, respectively, causing the resistors 650 and 670 to transition to L. When the logic states previously programmed into the memory portions $Q_2$ and $Q_3$ (e.g., the resistors 650, 660, and 670 were programmed at H, H, and L, respectively) are different, the voltages applied to the access lines D, S, F, and E correspond to or are equal to logic 0, logic 1, 2VDD, and logic 0, respectively, causing the resistors 650 and 660 to transition to L. Regardless of the logic states previously programmed to the resistors 650 to 670, each of the resistors 650 to 670 is reset to the low resistance state (L), i.e., breaking down the corresponding dielectric material.

In stage 1105 (programming/writing $Q_1$), two combinations of voltages applied to the access lines D, S, B, and A, respectively, are shown. To program the memory portion $Q_1$ into logic 0, the voltages applied to the access lines D, S, B, and A correspond to or are equal to logic 0, logic 1, VDD, and 2VDD, respectively, causing the resistors 630 and 640 each to transition from L to H. The resistor 620 may remain at L during/after such a programming operation. To program the memory portion $Q_1$ into logic 1, the voltages applied to the access lines D, S, B, and A correspond to or are equal to logic 0, logic 1, 2VDD, and VDD, respectively, causing the resistors 620 and 640 each to transition from L to H. The resistor 630 may remain at L during/after such a programming operation.

In stage 1107 (programming/writing $Q_3$), two combinations of voltages applied to the access lines D, S, F, and E, respectively, are shown. To program the memory portion $Q_3$ into logic 0, the voltages applied to the access lines D, S, F, and E correspond to or are equal to logic 0, logic 1, VDD, and 2VDD, respectively, causing the resistors 650 and 670 each to transition from L to H. The resistor 660 may remain at L during/after such a programming operation. To program the memory portion $Q_3$ into logic 1, the voltages applied to the access lines D, S, F, and E correspond to or are equal to logic 0, logic 1, 2VDD, and VDD, respectively, causing the resistors 650 and 660 each to transition from L to H. The resistor 670 may remain at L during/after such a programming operation.

In stage 1109 (programming/writing $Q_2$), two combinations of voltages applied to the access lines D, S, B, A, F, and E, respectively, are shown. To program the memory portion $Q_2$ into logic 0, the voltages applied to the access lines D, S, F, and E correspond to or are equal to logic 0, logic 1, 2VDD, and 2VDD, respectively, causing the resistor 650 to transition from H to L. The resistor 640 may remain at H during/after such a programming operation. To program the memory portion $Q_2$ into logic 1, the voltages applied to the access lines D, S, B, and A correspond to or are equal to logic 0, logic 1, 2VDD, and 2VDD, respectively, causing the resistor 640 to transition from H to L. The resistor 650 may remain at H during/after such a programming operation.

Figure 12:
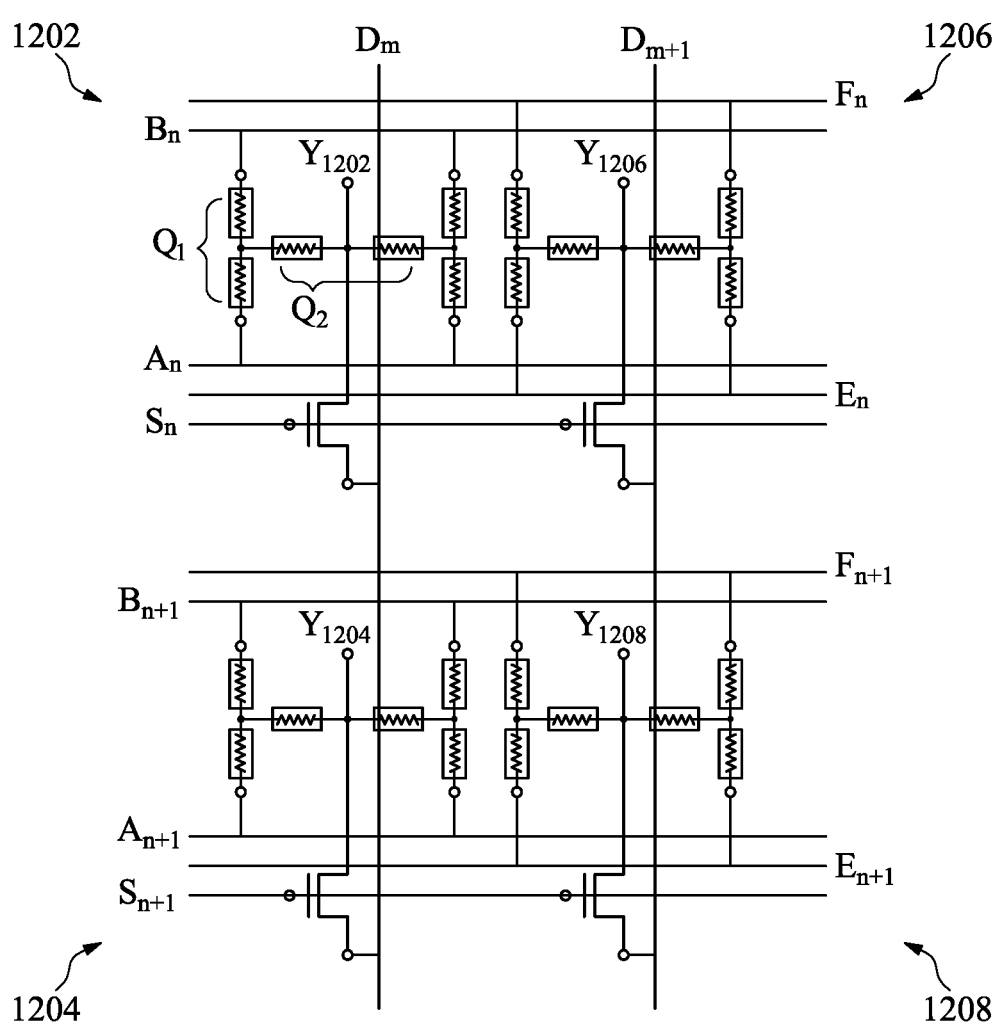
FIG. 12 illustrates a circuit diagram of a memory array including a number of the memory cells of FIG. 6, in accordance with some embodiments.

FIG. 12 illustrates an example circuit diagram of a memory array 1200 including a plural number of memory cells, 1202, 1204, 1206, and 1208, in accordance with some embodiments. The memory cells 1202 to 1208 can each be implemented as the memory cell 600 of FIG. 6. For example, each of the memory cells 1202 to 1208 includes a transistor and three pairs of resistors that form memory portions $Q_1$ to $Q_3$, and is connected to a corresponding set of access lines, D, S, A, B, E, and/or F. In FIG. 12, the memory cell 1202 is connected to access lines $A_n$, $B_n$, $D_m$, and $S_n$, with an output node $Y_{1202}$; the memory cell 1204 is connected to access lines $A_{n+1}$, $B_{n+1}$, $D_m$, and $S_{n+1}$, with an output node $Y_{1204}$; the memory cell 1206 is connected to access lines $E_n$, $F_n$, $D_{m+1}$, and $S_n$, with an output node $Y_{1206}$; and the memory cell 1208 is connected to access lines $E_{n+1}$, $F_{n+1}$, $D_{m+1}$, and $S_{n+1}$, with an output node $Y_{1208}$.

Figure 13:
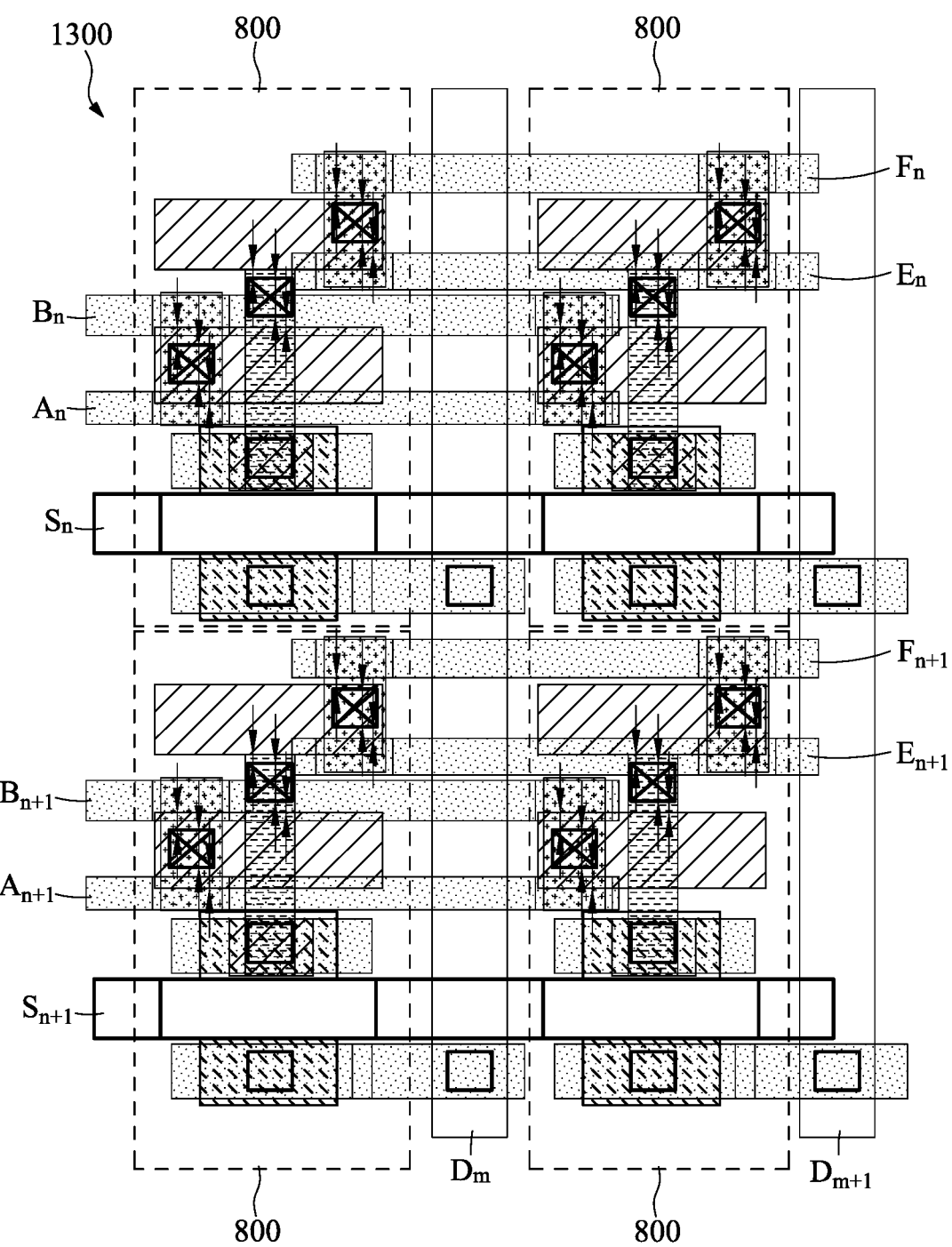
FIG. 13 illustrates an example layout of the memory array of FIG. 12, in accordance with some embodiments.

FIG. 13 illustrates an example layout 1300 that can be used to fabricate the memory array 1200 of FIG. 12, in accordance with various embodiments of the present disclosure. Similar to the layout 800, the layout 1300 has been simplified, and thus, it should be understood that the layout 1300 can include any of various other patterns, while remaining within the scope of the present disclosure. Further, the layout 1300 essentially includes four of the layouts 800 arranged as an array. For example, the array formed by the layout 1300 includes four memory cells that each have a transistor coupled to three pairs of resistors (each can be, e.g., represented as the memory cell 600 shown in FIG. 6). Each of these four memory cells can be formed by the layout 800, and thus, the description of the layout 1300 will not be repeated.

FIG. 14 illustrates a flow chart of an example method for fabricating a semiconductor device including at least one of the disclosed memory cell, in accordance with various embodiments of the present disclosure. For example, at least some of the operations (or steps) of the method 1400 can be performed to fabricate, make, or otherwise form the semiconductor device 700 (FIG. 7). Accordingly, the following discussion of the method 1400 may refer to some of the reference numerals used in FIGS. 6-8 as a non-limiting example. Further, the method 1400 is merely an example, and is not intended to limit the present disclosure. It should thus be understood that additional operations may be provided before, during, and after the method 1400 of FIG. 14, and that some other operations may only be briefly described herein.

The method 1400 starts with operation 1402 in which a transistor is formed along a major surface of a substrate. Using the semiconductor device 700 of FIG. 7 as an example, the transistor (e.g., 710) that is implemented as a FinFET is formed along the major surface of a substrate (e.g.

702). However, the transistor 710 may be formed in any of various other transistor structures, while remaining within the scope of the present disclosure.

The method 1400 proceeds to operation 1404 in which at least two first conductive lines, separated from each other, are formed in a first metallization layer. Continuing with the above example, the first conductive lines (e.g., 732 & 734, 772 & 774) are formed in the first metallization layer (e.g., M1 layer). The M1 layer is formed over the transistor 710. The first conducive lines 732 and 734 (or 772 and 774) are formed to be laterally separated from each other. Further, the first conductive lines 732 and 734 are physically and electrically isolated from each other with a first dielectric material; and the first conductive lines 772 and 774 are physically and electrically isolated from each other with a second dielectric material. In some embodiments, the first and second dielectric materials each include transition metal oxide that can be programmed between a first (e.g., high) resistance state and a second (e.g., low) resistance state.

The method 1400 proceeds to operation 1406 in which a first via structure having a lower portion laterally interposed between the at least two first conductive lines is formed. Still with the same example above, the first via structure (e.g., 736 or 776) is formed to have a lower portion laterally interposed between a corresponding pair of the first conductive lines. As shown in FIG. 7, the first via structure 736 has a lower portion laterally interposed between the first conductive lines 732 and 734; and the first via structure 776 has a lower portion laterally interposed between the first conductive lines 772 and 774. Further, the first via structure 736 is physically and electrically isolated from the first conductive line 732 with a portion of the first transition metal oxide, and from the first conductive line 734 with another portion of the first transition metal oxide; and the first via structure 776 is physically and electrically isolated from the first conductive line 772 with a portion of the second transition metal oxide, and from the first conductive line 774 with another portion of the second transition metal oxide.

The method 1400 proceeds to operation 1408 in which at least two second conductive lines, separated from each other, are formed in a second metallization layer. Continuing with the above example, the second conductive lines (e.g., 752 & 754) are formed in the second metallization layer (e.g., M5 layer). The M5 layer is formed over the M1 layer, which is further formed over the transistor 710. However, it should be understood that the second conductive lines can be formed in any of the metallization layers (e.g., M3 layer, M4 layer) above the M1 layer. The second conducive lines 752 and 754 are formed to be laterally separated from each other. Further, the second conductive lines 752 and 754 are physically and electrically isolated from each other with a third dielectric material. In some embodiments, the third dielectric material includes transition metal oxide that can be programmed between a first (e.g., high) resistance state and a second (e.g., low) resistance state.

The method 1400 proceeds to operation 1410 in which a second via structure having a lower portion laterally interposed between the at least two second conductive lines is formed. Still with the same example above, the second via structure (e.g., 756) is formed to have a lower portion laterally interposed between a corresponding pair of the second conductive lines. As shown in FIG. 7, the second via structure 756 has a lower portion laterally interposed between the second conductive lines 752 and 754. Further, the second via structure 756 is physically and electrically isolated from the second conductive line 752 with a portion of the third transition metal oxide, and from the second conductive line 754 with another portion of the third transition metal oxide.

In one aspect of the present disclosure, a memory device is disclosed. The memory device includes a memory cell comprising: a transistor; and one or more pairs of resistors coupled to the transistor in series, each of the one or more pairs of resistors including a first resistor and a second resistor. The transistor is formed along a major surface of a substrate, and the one or more pairs of resistors are respectively formed in one or more of a plurality of metallization layers disposed above the transistor.

In another aspect of the present disclosure, a memory device is disclosed. The memory device includes a memory cell comprising: a transistor; and a plurality of pairs of resistors coupled to the transistor in series, each of the pairs of resistors including a first resistor and a second resistor. The transistor is formed along a major surface of a substrate. At least a first one of the pairs of resistors are formed in a first one of a plurality of metallization layers disposed above the transistor. At least a second one of the pairs of resistors are formed in a second one of the plurality of metallization layers, the second metallization layer being disposed above the first metallization layer.

In yet another aspect of the present disclosure, a method for fabricating a memory device is disclosed. The method includes forming a transistor along a major surface of a substrate. The method includes forming a first metallization layer above the transistor, wherein the first metallization layer includes a plurality of first conductive lines laterally separated from one another with a first dielectric material. The method includes forming a first via structure having a lower portion laterally interposed between an adjacent pair of the first conductive lines.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory cell comprising:
    a transistor; and
    one or more pairs of resistors coupled to the transistor in series, each of the one or more pairs of resistors including a first resistor and a second resistor;
    wherein the transistor is formed along a major surface of a substrate, and the one or more pairs of resistors are respectively formed in one or more of a plurality of metallization layers disposed above the transistor;
    wherein the first resistor is formed of a first dielectric material laterally between a via structure and a first conductive line; and wherein the second resistor is formed of a second dielectric material laterally between the via structure and a second conductive line.

2. The memory device of claim 1, wherein the memory cell is configured as a one-time-programmable memory cell, in which one of the first resistor or the second resistor is configured to permanently switch from a first resistance state to a second resistance state.

3. The memory device of claim 1, wherein a first pair of the one or more pairs of resistors are formed in a first layer of the plurality of metallization layers, and a second pair of the one or more pairs of resistors are formed in a second layer of the plurality of metallization layers, and wherein the first layer is vertically spaced from the second layer.

4. The memory device of claim 1, wherein the first conductive line and the second conductive line are formed in an identical one of the plurality of metallization layers.

5. The memory device of claim 1, wherein the via structure has a lower portion laterally interposed between the first conductive line and the second conductive line.

6. The memory device of claim 1, wherein the first dielectric material and the second dielectric material each include transition metal oxide.

7. The memory device of claim 1, wherein the via structure, the first conductive line, and the second conductive line each include copper.

8. The memory device of claim 1, wherein the transistor is part of a front-end-of-line (FEOL) network, and the one or more pairs of resistors are part of a back-end-of-line (BEOL) network.

9. A memory device, comprising:
a memory cell comprising:
    a transistor; and
    a plurality of pairs of resistors coupled to the transistor in series, each of the plurality of pairs of resistors including a first resistor and a second resistor;
    wherein the transistor is formed along a major surface of a substrate;
    wherein at least a first pair of the plurality of pairs of resistors are formed in a first layer of a plurality of metallization layers disposed above the transistor;
    wherein, for each respective pair of the plurality of pairs of resistors:
        the first resistor of the respective pair is formed of a first dielectric material laterally between a via structure and a first conductive line; and
        the second resistor of the respective pair is formed of a second dielectric material laterally between the via structure and a second conductive line.

10. The memory device of claim 9, wherein the memory cell is configured as a one-time-programmable memory cell, in which one of the first resistor or the second resistor is configured to permanently switch from a first resistance state to a second resistance state.

11. The memory device of claim 9, wherein the first conductive line and the second conductive line are formed in an identical one of the plurality of metallization layers.

12. The memory device of claim 9, wherein the via structure has a lower portion laterally interposed between the first conductive line and the second conductive line.

13. The memory device of claim 9, wherein the first dielectric material and the second dielectric material each include transition metal oxide.

14. The memory device of claim 9, wherein the via structure, the first conductive line, and the second conductive line each include copper.

15. The memory device of claim 9, wherein the via structure has an upper portion that vertically extends away from the first conductive line and the second conductive line.

16. A memory device, comprising:

a memory cell comprising:

a transistor; and a first resistor and a second resistor each coupled to the transistor in series;

wherein the transistor is formed along a major surface of a substrate;

wherein the first resistor and the second resistor are both formed in one metallization layer of a plurality of metallization layers disposed above the transistor; and wherein the first resistor and the second resistor are disposed symmetrically to each other with respect to a via structure.

17. The memory device of claim 16, wherein the first resistor is formed based on a first dielectric material laterally between the via structure and a first conductive line, and the second resistor is formed based on a second dielectric material laterally between the via structure and a second conductive line; and wherein the first conductive line and the second conductive line are disposed at the one metallization layer.

18. The memory device of claim 16, wherein the memory cell is configured as a one-time-programmable memory cell, in which one of the first resistor or the second resistor is configured to permanently switch from a first resistance state to a second resistance state.

\* \* \* \* \*